United States Patent [19]

Watanabe

[11] Patent Number: 4,682,239
[45] Date of Patent: Jul. 21, 1987

[54] VERY LARGE VIDEO DISPLAY APPARATUS WHICH CAN BE CONSTRUCTED OF A NUMBER OF MODULAR UNITS

[75] Inventor: Yuji Watanabe, Tokyo, Japan

[73] Assignee: Sony Corporation, Tokyo, Japan

[21] Appl. No.: 689,599

[22] Filed: Jan. 8, 1985

[30] Foreign Application Priority Data

Jan. 13, 1984 [JP] Japan .................................. 59-5389
Jan. 27, 1984 [JP] Japan .................................. 59-13877

[51] Int. Cl.$^4$ ....................... H04N 3/14; H04N 5/70
[52] U.S. Cl. ................................... 358/241; 358/59; 340/781
[58] Field of Search ................. 358/241, 59, 141, 11; 340/793, 781

[56] References Cited

U.S. PATENT DOCUMENTS

| 4,142,181 | 2/1979 | Moricca et al. | 358/240 X |
|---|---|---|---|
| 4,210,934 | 7/1980 | Kutaragi | 358/241 |
| 4,516,118 | 5/1985 | Wahlquist | 340/793 X |
| 4,521,774 | 6/1985 | Murphy | 340/745 |
| 4,554,539 | 11/1985 | Graves | 340/793 X |
| 4,581,655 | 4/1986 | Ide et al. | 358/241 X |

Primary Examiner—Michael A. Masinick
Assistant Examiner—E. Anne Toth
Attorney, Agent, or Firm—Hill, Van Santen, Steadman & Simpson

[57] ABSTRACT

A video display system is disclosed which has a video signal source for supplying the video signal of odd fields and even fields which are interlaced with each other, a first set of display cells for the odd fields, a second set of display for the even fields and arranged alternately with the first set of display cells in an interlaced fashion, a first circuit for supplying the video signal of the odd fields to the first set of display cells during the odd fields, and a second circuit for supplying the video signal of the even fields to the second set of display cells during the even fields. In this case, the first circuit includes a latching circuit for latching the video signal of the odd fields and supplying the latched signal to the first set of display cells during the even fields, and the second circuit includes a latching circuit for latching the video signal of the even fields and supplying the latched signal to the second set of display cells during the odd fields.

7 Claims, 30 Drawing Figures

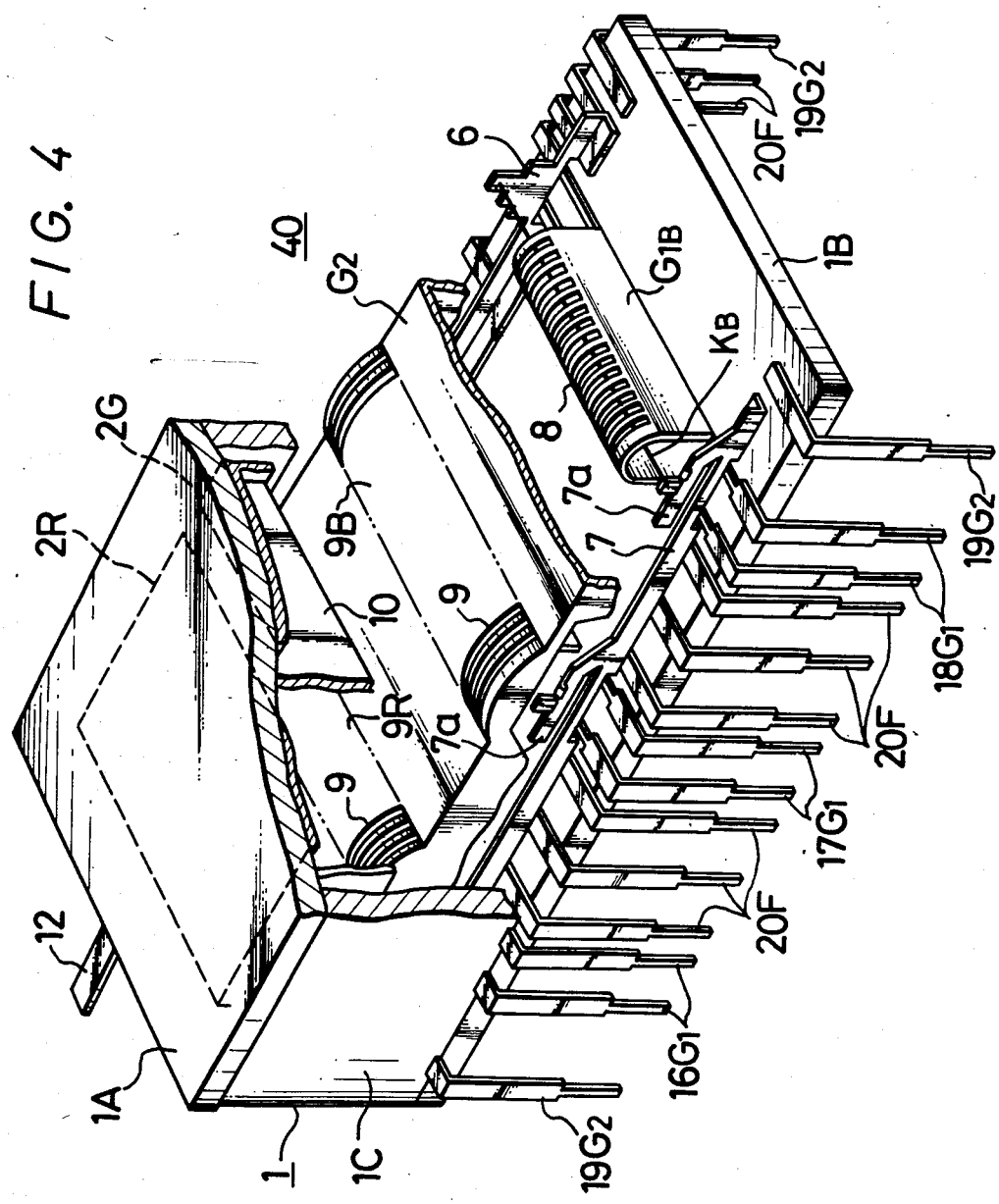

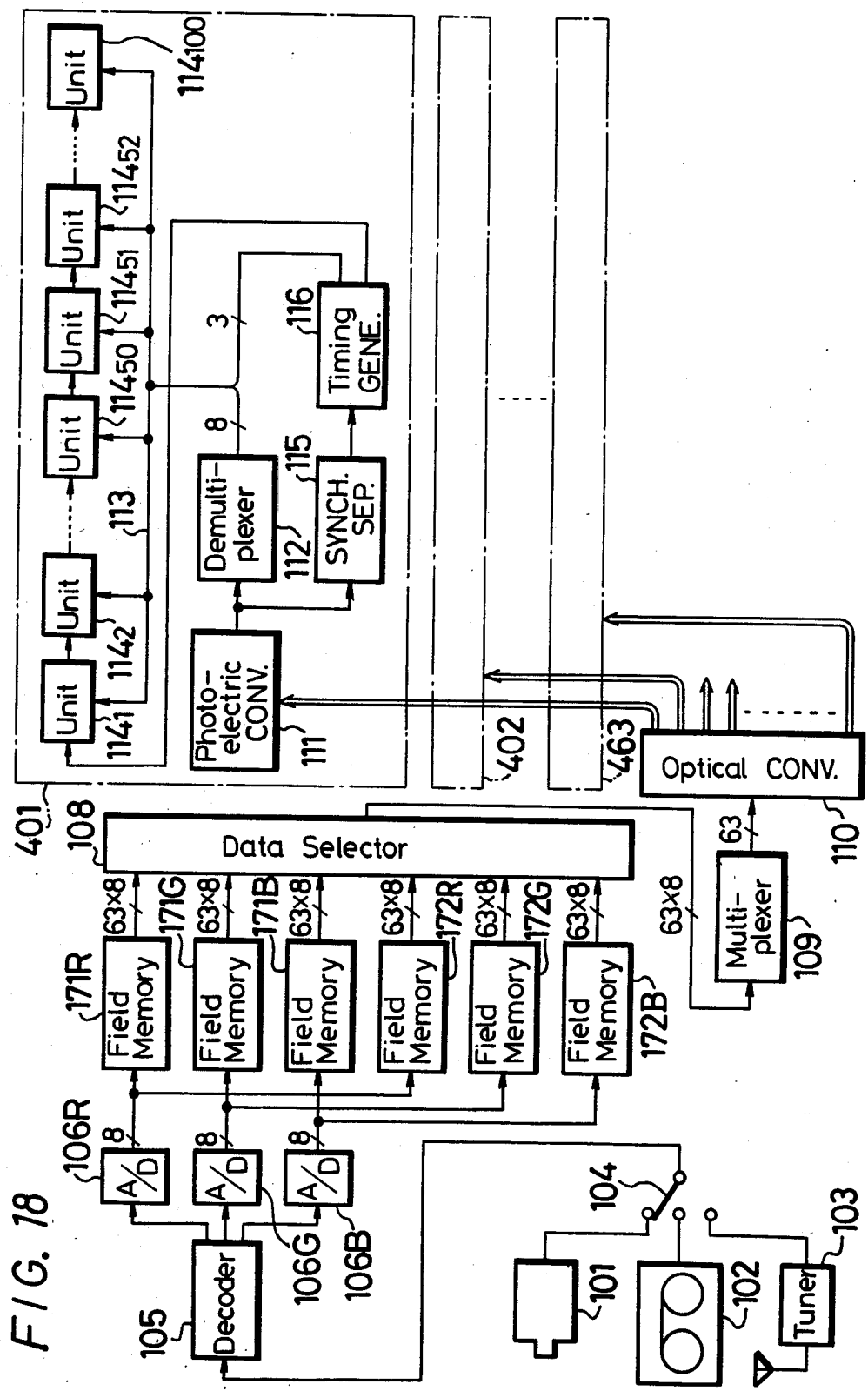

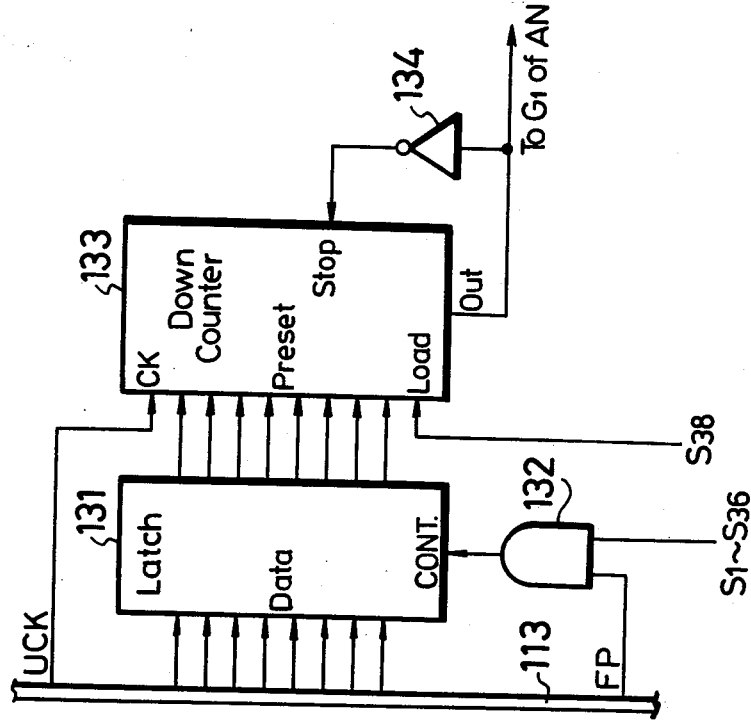

FIG. 20A (FP)
FIG. 20B (UCK)
FIG. 20C (ECK)
FIG. 20D (SSP)
FIG. 20E
FIG. 20F (Data)
FIG. 20G (SSP')

VERY LARGE VIDEO DISPLAY APPARATUS WHICH CAN BE CONSTRUCTED OF A NUMBER OF MODULAR UNITS

BACKGROUND OF THE INVENTION

1. Field of the Invention

The present invention relates generally to a video display device and is directed more particularly to a video display system in which a number of display cells are arranged in a 2 dimensional fashion or in an X-Y matrix form and these display cells are respectively driven by desired data to display a desired image.

2. Description of the Prior Art

A video display device in which a number of display cells are arranged in an X-Y matrix form and these display cells are respectively driven by desired data to display a desired picture has already been proposed.

The same applicant has proposed as the following described display cell as useable in such video display devices.

Referring to FIGS. 1 to 4, which are, respectively, a front view of a luminescent display cell, a sectional view taken on line A—A thereof, a sectional view taken on line B—B thereof, and a partially cut-away perspective view of the cell. In the figures, reference numeral 1 denotes a glass envelope comprising a front panel 1A, a rear plate 1B and a side wall 1C. Within the glass envelope 1 are disposed a plurality of luminescent display segments 2 (2R, 2G, 2B), a plurality of cathodes K ($K_R$, $K_G$, $K_B$) and first grids $G_1$ ($G_{1R}$, $G_{1G}$, $G_{1B}$) in corresponding relation to each display segment, and a common second grid (accelerating electrode) $G_2$. The display segments 2 each comprise a phosphor layer formed on the inner surface of the front panel 1A. There are formed three display segments 2R, 2G, and 2B for the luminescence of red, green and blue, respectively. More particularly, as shown in FIG. 5, a carbon layer 3 as a conductive layer is printed in the form of a frame on the inner surface of the front panel 1A. In spaces in the frame, red, green and blue phosphor layers 2R, 2G and 2B are formed by printing as display segments so as to partially overlap the carbon layer 3. Throughout the surfaces of these phosphor layers a metal back layer 5 is formed, e.g. an aluminum layer, with a filming layer 4. Furthermore, in opposed relation to the display segments 2R, 2G and 2B comprising the above phosphor layers and inside the rear panel 1B wire cathodes $K_R$, $K_G$ and $K_B$ are positioned as well as first grids $G_{1R}$, $G_{1G}$ and $G_{1B}$ which are mounted opposite to the wire cathodes, and a second grid $G_2$ which is in common to the three first grids $G_{1R}$, $G_{1G}$ and $G_{1B}$. Each wire cathode K is formed, for example, by coating the surface of a tungsten heater with carbonate which serves as an electron emissive material. The wire cathodes $K_R$, $K_G$ and $K_B$ are each stretched between a pair of conductive support members 6 and 7 which are disposed on opposite side portions of the rear panel 1B. One support member 6 is for fixing one end of each wire cathode, while the other support member 7 is provided with a spring portion 7a to which is fixed the other end of each wire cathode. This arrangement assures an even and uniform extension of the wire cathode even during rises of temperature in that temperature expansion would be absorbed by the spring portion 7a, and thus the wire cathode never becomes loose and is held straight. The first grids $G_{1R}$, $G_{1G}$ and $G_{1B}$ are formed in a half-cylindrical shape having a cylindrical surface which corresponds to the wire cathodes, and a plurality of slits 8 are formed in the cylindrical surface with a predetermined pitch along the longitudinal direction of the first grids. The slits 8 allow the transmission therethrough of electrons which are radiated from the wire cathode K. The second grid $G_2$ is formed with slits 9 at portions corresponding to the slits 8 in the first grids $G_{1R}$, $G_{1G}$, and $G_{1B}$. In this case, slit portions 9R, 9G and 9B of the second grid $G_2$ may be formed so as to have cylindrical surfaces which are concentric with the corresponding first grids $G_{1R}$, $G_{1G}$ and $G_{1B}$. In this construction, electron beams from the wire cathodes are radiated rectilinearly through the slits 8 and 9 of the first and second grids and are spread with respect to the longitudinal direction of the slits. On the other hand, the portions of the second grid in which are formed the slits 9 may be horizontal as shown in FIG. 6. In this case, the electron beam is radiated so that it passes through the second grid and then is curved somewhat inwardly with respect to the longitudinal direction of the slits, as shown in dotted line 30'.

On the other hand, a separator 10 formed of a conductive material is disposed to surround the display segments or elements 2R, 2G and 2B. The separator 10 not only serves as a shield for preventing secondary electrons 31 (see FIG. 6) induced by impingement of the electron beam from the cathode against the first and/or second grid $G_1$ or $G_2$ from rendering an adjacent display segment luminous, but also serves to form a diffusion lens which functions to spread the electron beams 30 from each wire cathode K so that the electron beam is radiated throughout the corresponding display segment 2. In addition, the separator 10 is used also as a power supply means for supplying a high voltage, e.g. 10 KV, to each display segment. During assembly, the separator 10 is supported between the front panel 1A and the side wall 1C of the glass envelope 1 and is fixed by frit. More specifically, as shown in FIG. 7, the separator 10 is in the form of a frame partitioned to form three enclosures to surround the display segments, and on first opposed upper ends thereof are formed outwardly projecting supporting pieces 11, and on the other opposed upper ends are formed anode leads 12 for the supply of high voltage (anode voltage). Furthermore, on the side portions of the separator 10 are formed outwardly bent elastic positioning pieces 13. When the separator 10 is inserted from above into the inside of side wall 1C, as shown in FIG. 8, the supporting pieces 11 abut the upper end face of the side wall 1C to thereby support the separator 10, and at the same time the bent portions 13 abut the inner surface of the side wall 1C to thereby position the separator 10 in a central position. Also provided on the upper end portion of the separator 10 are inwardly bent lugs 14 each of which have a projection 15 which is formed on the surface thereof. When the front panel 1A is placed on and sealed to the side wall 1C after enclosing the separator 10 in the side wall 1C, the projections 15 contact the carbon layer 3 or the metal back layer 5 (see FIG. 9). As a result, the high voltage from the anode leads 12 is fed in common to the display segments 2R, 2G and 2B. In an assembled state, the anode leads 12 to which are applied the high voltage are drawn out to the exterior through the sealed portion between the front panel 1A and the upper end face of the side wall 1C, while the leads of the wire cathodes K, the first grid $G_1$, and the second grid $G_2$ are drawn out to the exterior through a sealed portion between the rear plate 1B and the side wall 1C. The leads of the cathodes K, the first grids $G_1$, and second grid $G_2$ are brought out together for supporting purposes. For example, in each of the first grids $G_{1R}$, $G_{1G}$ and $G_{1B}$, two leads on each side, namely, a total of four leads on both sides, are brought out as leads $16G_1$, $17G_1$, and $18G_1$ (see FIG. 4). In the case of the second grid $G_2$, four leads $19G_2$ are brought out at positions corresponding to the four corners of the rear panel. Leads 20F for each end of the cathodes K are brought out to the right and left from both of the support members 6 and 7. The leads 20F of the cathodes are electrically connected to supply power to each of the support members 6 and 7 to the cathodes. The leads for the first and second grids $G_1$ and $G_2$ are connected so as to provide the correct voltage thereto.

The glass envelope 1 is formed by sealing the front panel 1A, the side wall 1C and the rear plate 1B to each other with frits 22 (see FIG. 9). To the rear plate 1B is connected a chip-off pipe 21 for the gas exhaust caused by the frit.

Operation of the above device will now be explained. An anode voltage of, say, 10 KV or so is supplied through the anode leads 12 to the red, green and blue display segments 2R, 2G and 2B. To each of the first grids $G_{1R}$, $G_{1G}$ and $G_{1B}$ is applied a voltage of, say, 0–30 V, while to the second grid $G_2$ is applied a voltage of, say, 300 V . The wire cathodes $K_R$, $K_G$ and $K_B$ have capacities of 60–70 mW or so per wire. In this construction, the anode side and the second grid $G_2$ are fixed in voltage, while the voltage applied to the first grids $G_1$ is changed to selectively turn on and off the display segments. More particularly, when OV is applied to a first grid $G_1$, an electron beam from cathode K is cut off and the corresponding display segment 2 is not rendered luminous. When, say, 30 V is applied to a first grid $G_1$, an electron beam from cathode K passes through the first grid $G_1$, then is accelerated by the second grid $G_2$ and impinges upon the phosphor of the corresponding display segment 2 to make the latter luminous. At this time, the luminance is controlled by controlling the pulse width (duration) of the voltage (30 V) applied to the first grid $G_1$. Further, as shown in FIG. 6, the electron beam from cathode K is spread by the separator 10 and is radiated to the entire surface of the display segment 2. When the electron beam from the cathode impinges upon the first and second grids, there are produced secondary electrons 31 from these grids, but these secondary electrons are obstructed by the separator 10, so they do not impinge upon the adjacent display segment 2. In this way, by selectively controlling the voltage applied to the first grids, the display segments 2R, 2G and 2B are selectively rendered luminous at a high luminance.

This luminescent display cell 40 is constructed so as to be thin. Besides, the low voltage-side leads such as the cathode and first and second grid leads are drawn out from the rear plate 1B side of the glass envelope 1, while the high voltage-side anode leads 12 are drawn out from the front panel 1A side. Therefore, possible dangers during discharge and wiring can be avoided, thus ensuring a stable luminescent display.

Moreover, since the anode voltage-applied separator 10 surrounds each display segment 2, a diffusion lens is formed by the separator 10. Therefore, even if only the first grids $G_1$ are curved and the second grids $G_2$ are flat (as shown in FIG. 6), the electron beam from cathode K spreads laterally (in the direction of the slits) and is radiated to the entire surface of the display segment 2. At the same time, the secondary electrons from the first or second grids are obstructed by the separator 10, so the adjacent cut-off segment is not rendered luminous.

In the case of a color display (for example, in the case of a 9300° K. white picture), the luminance mixing ratio is about 7% blue, about 13% red, and about 80% green. In the case where wire cathodes are used as an electron emission source, they are in many cases used in a temperature controlled area in order to maintain their service life. The problem of making the luminance of the green cathode higher than that of the other cathodes can be solved by increasing the number of the green cathodes used. For example, two green cathodes $K_G$, one red cathode $K_R$, and one blue cathode $K_B$ may be used. As a result, the total amount of electrons for green becomes larger than that for red and blue, thus making it possible to effect an improved color display. Red and blue cathodes may also be used in plural numbers, which is effective in prolonging their service life. Thus, by increasing the number of green cathodes in comparison with the other cathodes, the luminance of green can be enhanced and a good white balance can be obtained. Consequently, an excessive load is not imposed on the cathodes, that is, the life of the luminescent display cell can be prolonged. Actually, two green cathodes are disposed in spaced relation at a distance of about 0.8 to 1 mm. An increase of 70 to 80% of the amount of electrons emitted, can be expected with two cathodes though it does not become twice as large as that of a single green cathode due to the electron scattering effect. Alternatively, the green luminance may be enhanced by making the area of the green phosphor layer larger than that of the red and blue phosphor layers.

Since the wire cathodes are used in the temperature controlled area, that is, the loading of the oxide cathode is set at a ratio of one to several tens to prevent a red-looking appearance, the amount of electrons emitted per cathode is small. One method for solving this problem is to substantially enlarge the surface area of the oxide by winding a tungsten wire spirally, for example to form the cathode. But, in the case of a long spiral, it is likely that there will occur loosening or vibration of the cathode. The construction as shown in FIGS. 10 and 11 is suggested.

In this example, a core 35 formed of a high-temperature material such as, for example, tungsten or molybdenum, is provided and its surface is coated with an insulating material 36 such as $Al_2O_3$. Then tungsten wire 37 serving as a heater is wound spirally thereon and an electron emissive material 38, e.g. carbonate, is bonded to the spiral portion by spraying or electrodeposition to constitute a directly heated cathode 34. The core 35 has one end attached to one support member 6 and the other end is attached to the spring portion 7a of the other support member 7 by spot welding or other suitable means and it stretched under tension. The tungsten wire is fixed between one support member 6 on one side and a second support member 6' on the other side by spot welding or other suitable means.

Thus, in the above construction, the cathode is wound spirally onto the core 35 and is coated with insulating material 36, and the core 35 is stretched by the spring portion, whereby problems such as shorting between spiral portions and thermal deformation of the spiral can be eliminated. Besides, the oxide surface area is substantially increased, and a uniform temperature distribution area (A) with a reduced temperature difference between both ends and the center of the cathode becomes wider. As a result, the amount of electrons emitted are increased, and as a whole, therefore, it is possible to increase the amount of allowable current per cathode. The curve I in FIG. 11 illustrates the temperature distribution over the cathode.

Thus, the luminescent display cell is formed. In this case, since the separator is supplied with the same high voltage as that applied to the display segments and is positioned to surround the plural display segments, a diffusion lens is formed whereby an electron beam from the cathode is spread laterally and radiated to the entire surface of each display segment or element. Consequently, it is possible to make a display at having a high luminance. Furthermore, the separator obstructs secondary electrodes from a control electrode or accelerating electrode and the adjacent cut-off display segment are not rendered luminous, and thus a stable luminescent display can be obtained.

When a picture display device is formed by using the above luminescent display cell, the following method for assembling is used.

That is, a plurality of the above luminescent display cells 40, for example, 6 (column)+4 (row)=24 luminescent display cells are incorporated in a unit case 41 to form one unit as shown in FIG. 12. In mounting such plural display cells to the unit case 41, the cells 40 are fixed to the case 41 by molding with resin or the like. However, the anode voltage of the display cell 40 is as high as about 10 kV, so if the attachment is incomplete, the display cell 40 may become separated from the surface upon application of power, or the application on the surface of a liquid for removing stains. Changes in conditions may also cause such trouble. Therefore, it is necessary to fix the display cells 40 firmly to the unit case 41. For this purpose, each display cell 40 is formed so that the front panel 1A of the glass envelope 1 overhangs outwardly beyond the side wall 1C. In this case, the front panel 1A may overhang throughout the circumference as shown in FIG. 13A, or it may overhand only in one direction as shown in FIG. 13B. On the other hand, the unit case 41 is constructed as shown in FIG. 14, that is, plural (24 in the illustrated embodiment) window holes 43 are formed in a front plate 42 of the unit case 41 in opposed relation to the display cells 40, and a stepped portion 44 in which is to be fitted the marginal portion of the front panel 1A of each display cell is formed in the back of the marginal portion of each window hole 43. The display cell 40 is fitted in the back of the front plate 42 so that its front panel 1A faces the window hole 43, and then is fixed from the back by the use of a fixing agent 45 such as a resin mold or the like. In this case, since the front panel 1A overhangs outwardly as an overhang portion 50, this overhang portion is held between the fixing agent 45 and the front plate 42 of the unit case 41, and thus, as a whole, the display cell 40 is fixed firmly to the unit case 41. If necessary, as shown in FIGS. 15 and 16, there may be provided a retaining piece 53 which is rotatable about a shaft 52 to hold the overhang portion 50 of the front panel 1A of each display cell between it and the front plate 42 of the unit case 41. Subsequent fixing with resin which is molded will further ensure the fixing of the display cell. Since the display cell is of a high luminance, the front panel side with phosphor layers applied thereto is apt to have a high temperature, so it is necessary to cool it, for example, with liquid. For this purpose, at the time of mounting each display cell to the unit case, a packing 54, e.g. silicone rubber, is interposed between the stepped portion 44 of the front plate 52 of the unit case 41 and the front panel 1A, and a transparent plate 55 formed of polycarbonate or other material is disposed thereabove, and the space formed by the transparent plate 55, the front panel 1A and the window hole 43 of the unit case 41 is filled with a cooling liquid 56. In this case, the front plate 42 of the unit case 41 is formed with cooling liquid introducing slots 57 which communicate with the window holes 43. Instead of using the cooling liquid 56, a fan can be provided to perform air-cooling for the display cell.

Then, a plurality of the above units are arranged in an X-Y matrix form, for example, 7 (column)×5 (row)=35 to form a block and then 5 blocks are arranged laterally to form a submodule. Then, a plurality of the submodules are combined in an X-Y matrix form, for example, 9 (column)× 4 (row)=36. By using a number of the submodules, a jumbo-size picture display tube of, for example, 25 m (column)×40 m (row) is constructed. In this case, the number of the display cells is $$36 \times 5 \times 35 \times 24 = 151,200$$

and the number of the display segments is 3 times the above number and hence about 450,000.

FIGS. 17A and 17B are respectively a front view and a cross-sectional view of whole of a built-up jumbo-size picture display device. The whole of this jumbo-size picture display device is a rectangular building structure which is, for example, 42 m in height and 47 m in width. The upper portion of this structure is made as a display portion which is provided with 9 floors, each floor having the height of 2.688 m. On each floor there are located 4 submodules in the lateral direction. Further, on the lower portion of the building there are formed the stage for entertainers, an anteroom, the central control room for operating and managing the display device and the stage and so on.

In the above manner, the picture display device is built. In this case, since 24 luminescent display cells form a unit and a number of the units are employed to assemble the whole picture display device, the display device becomes easy to handle and is also easy to assemble. In this case, each unit is formed as a square shape of 40 cm in both height and width in the above example.

In such picture display device, when the display signal for each display cell is transmitted, it is impossible to perform the signal transmission in parallel for about 450,000 picture segments or elements. Thus, the signal transmission is carried out by the scanning method. In this case, however, the structure of the display device is of a unit utilization type, if the known line-sequence scanning is employed, a large number of connections between the respective units in the lateral direction is required and hence the installation work thereof becomes complicated.

Further, since the display device is a jumbo one as set forth above, if the signal transmission is carried out in analog fashion, there is easily caused an errors such as crosstalk, time-base errors and so on. Thus, it is desirable that the signal be transmitted in the form of a digital signal. However, if a flat cable is generally used as the transmission line, the transmission speed is generally suppressed to about 300 kHz. On the other hand, the time to send the signal to the whole picture screen is limited to 1/30 second.

Further, in the above display device, the display cell is designed so as to be poor in linearity of luminance variation which makes the same inexpensive so that it may be considered to perform the luminance-modulation by the PWM (pulse width modulation). However, a prior art circuit which carries out PWM is complicated and, with PWM at every 1/30 second, when the display time period becomes short, flicker becomes conspicuous at low luminance.

OBJECTS AND SUMMARY OF THE INVENTION

Accordingly, an object of the present invention is to provide a video display system in which a signal can be easily transmitted.

Another object of this invention is to provide a video display system in which the luminance modulation can be effectively carried out by a simple circuit construction.

A further object of the present invention is to provide a video display device which can be easily assembled and repaired.

According to an aspect of the present invention, there is provided a video display system comprising:
a video signal source for supplying a video signal of odd fields which are and even fields interlaced each other;
a first set of display cells for said odd fields;
a second set of display cells for said even fields arranged alternately with said first set of display cells in an interlaced fashion;
first means for supplying the video signal of said odd fields to said first set of display cells during even fields; and
second means for supplying the video signal of said even fields to said second set of display cells during odd fields succeeding said even fields; characterized in that
said first means includes latching means for latching the video signal of said odd fields and supplying the latched signal to said first set of display cells during said even fields succeeding to said odd fields; and
said second means includes latching means for latching the video signal of said even fields and supplying the latched signal to said second set of display cells during said odd fields succeeding to said even fields.

According to another aspect of the present invention, there is provided a video display system comprising:
a plurality of display cells arranged in an X-Y matrix form;
a video signal source for supplying the video signal of odd fields and even fields; and
driving means for supplying the video signal of said odd and even fields to said display cells such that half of the display cells are driven during said odd fields and the other half of the display cells are driven during said even fields; characterized in that said driving means includes latching means for latching the video signal in order to supply the latched video signal to said half of the display cells for a display during said even fields and in order to supply the latched signal to said other half of display cells for a display during said odd fields.

According to a further aspect of the present invention, there is provided a video display system comprising:
a video signal source for supplying a video signal of odd fields and even fields interlaced with each other;
a first set of display cells for said odd fields;
a second set of display cells for said even fields arranged alternately with said first set of display cells in an interlaced fashion;
said first and second sets of display cells being separated into a plurality of units each of which includes display cells arranged in an X-Y matrix form; and
driving means for supplying said video signal to said units; characterized in that
said driving means supplies the video signal to said units in a manner that the display cells included in one unit are supplied with the video signal in succession to complete a whole display of said one unit and the display cells included in a neighboring unit are next supplied with the video signal to complete a whole display of said neighboring unit.

According a still further aspect of the invention, there is provided a video display system comprising:
a video display source for supplying a video signal;
a plurality of units arranged to form a display device, each of said units including a plurality of display cells arranged in an X-Y matrix form; and
driving means for supplying said video signal to said units; characterized in that
said driving means supplies the video signal to said units in a manner that the display cells included in one unit are supplied with the video signal in succession to complete a whole display of said one unit and the display cells included in a neighboring unit are next supplied with the video signal to complete a whole display of said neighboring unit.

The other objects, features and advantages of the present invention will become apparent from the following description taken in conjunction with the accompanying drawings through which the like references designate the same elements and parts.

BRIEF DESCRIPTION OF THE DRAWINGS

FIG. 4 is a partially cut-away perspective view of the liminescent display cell in FIG. 1;

FIG. 18 is a block diagram showing a video display system according to the present invention;

FIGS. 19 and 21 are schematic diagrams respectively showing a signal supplying system according to the present invention;

FIGS. 20A to 20G are waveform diagrams respectively to be used for explaining the video display system according to the present invention; and FIG. 22 is a schematic diagram showing a PWM driving circuit according to the present invention.

DESCRIPTION OF THE PREFERRED EMBODIMENT

Figure 1:
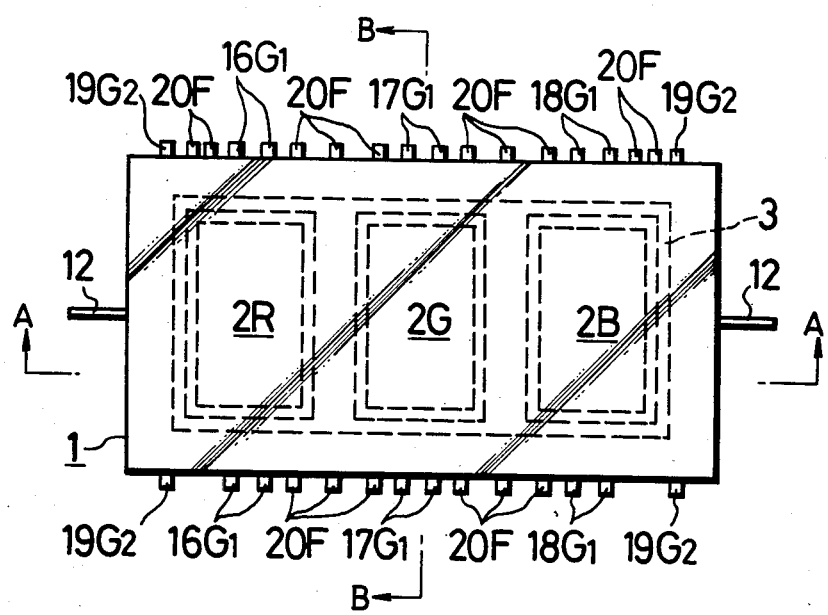
FIG. 1 is a front view of a luminescent display cell used in the present invention.
Figure 2:
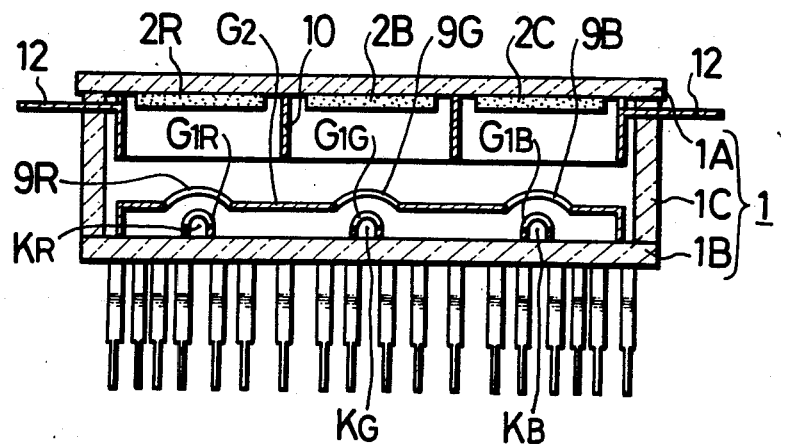
FIG. 2 is a sectional view taken on line A—A of FIG. 1.
Figure 3:
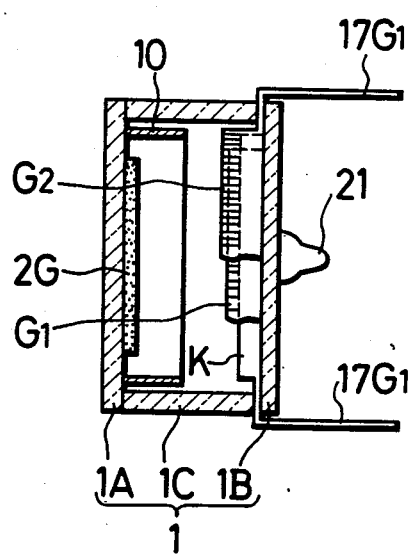
FIG. 3 is a sectional view taken on line B—B of FIG. 1.
Figure 5:
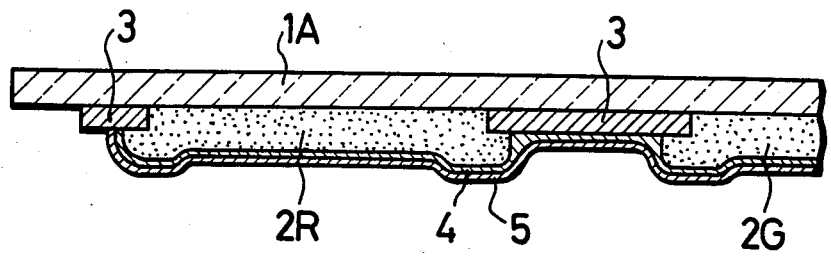
FIG. 5 is an enlarged sectional view of a display segment.
Figure 6:
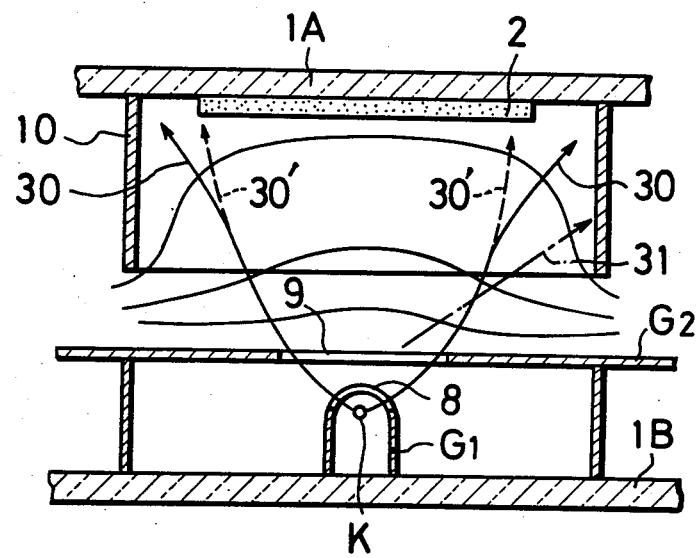
FIG. 6 is a sectional view illustrative of operation of a separator.
Figure 9:
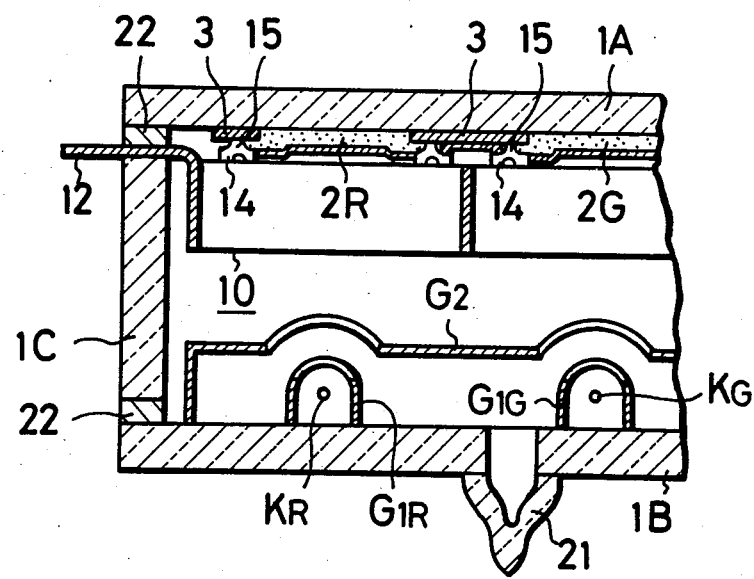
FIG. 9 is a sectional view of display segments and a separator portion.
Figure 7:
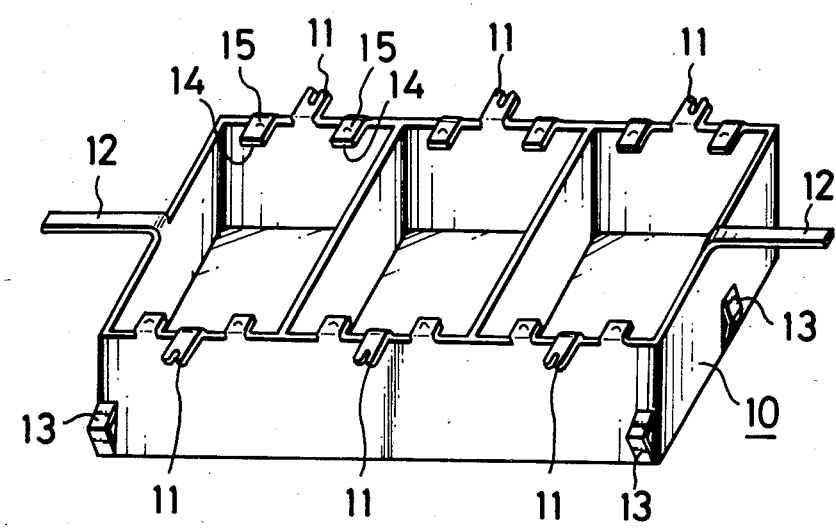
FIG. 7 is a perspective view of the separator.
Figure 8:
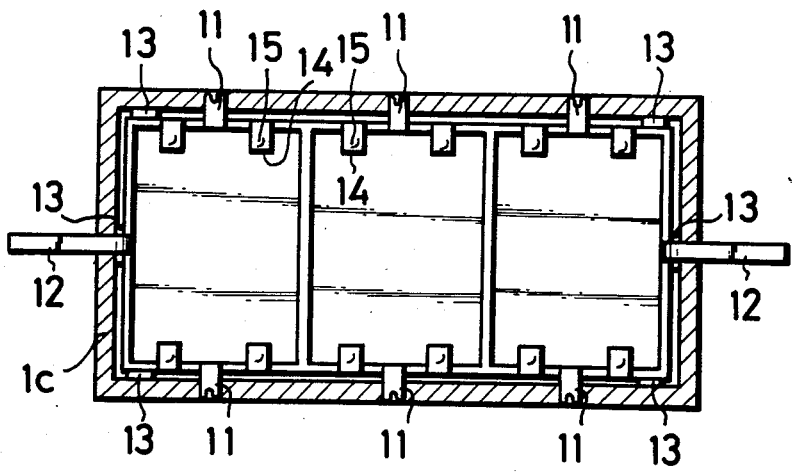
FIG. 8 is a plan view in which the separator is disposed within a side of an envelope.
Figure 10:
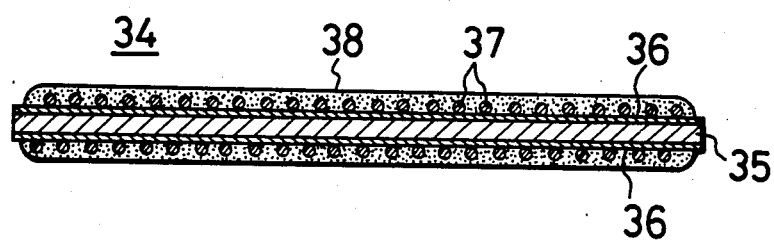
FIG. 10 is a sectional view showing another example of a wire cathode.
Figure 11:
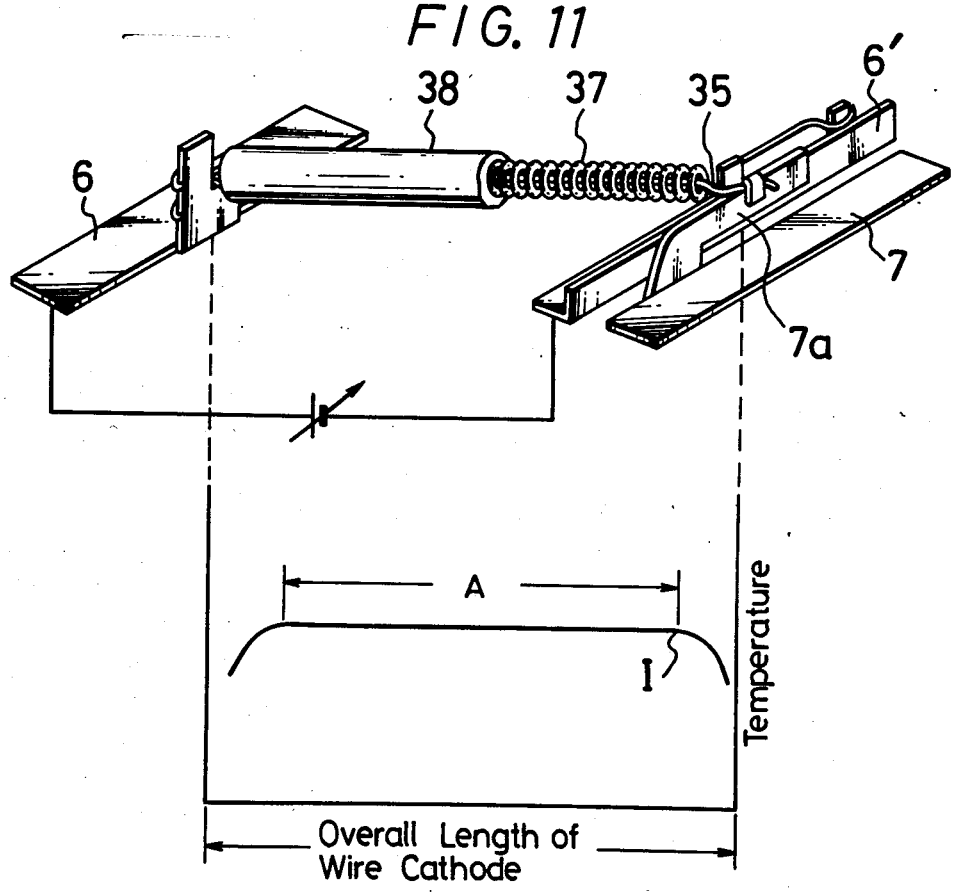
FIG. 11 is a perspective view showing a mounted state thereof.
Figure 12:
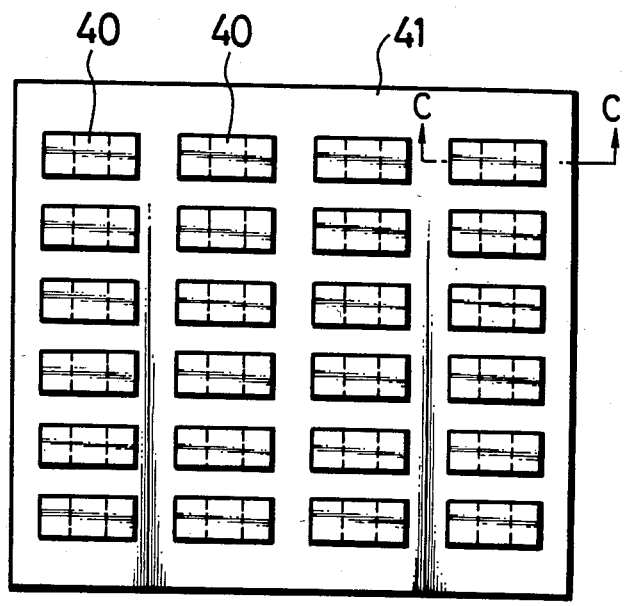
FIG. 12 is a front view of a single unit incorporating plural display cells.
Figure 13A:
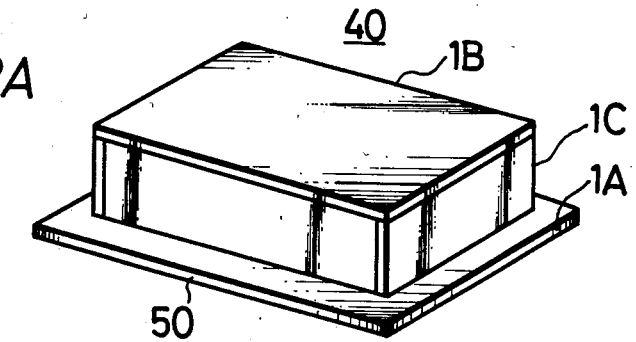
FIGS. 13A and 13B are perspective views showing other examples of display cells.
Figure 13B:
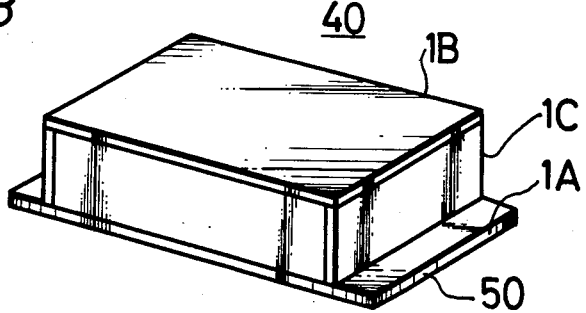
Figure 14:
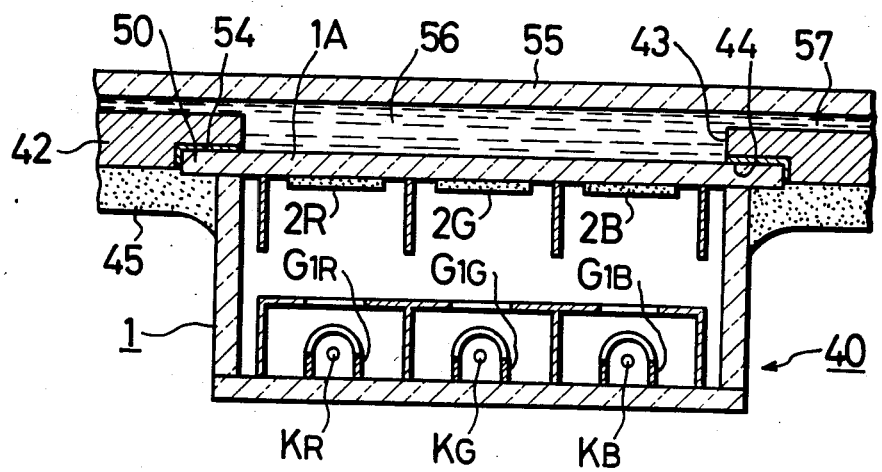
FIG. 14 is a sectional view taken on line C—C of FIG. 12.
Figure 15:
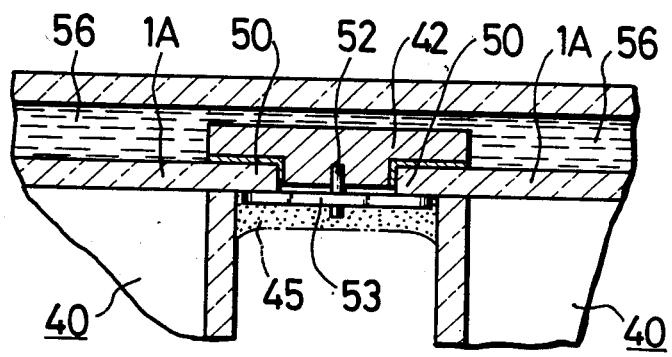
FIG. 15 is a sectional view showing another mounting method.
Figure 16:
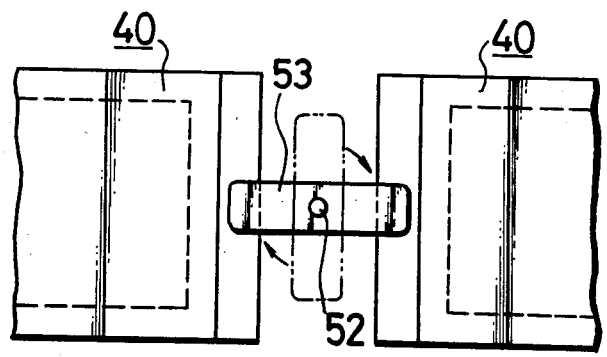
FIG. 16 is a rear view thereof.
Figure 17B:
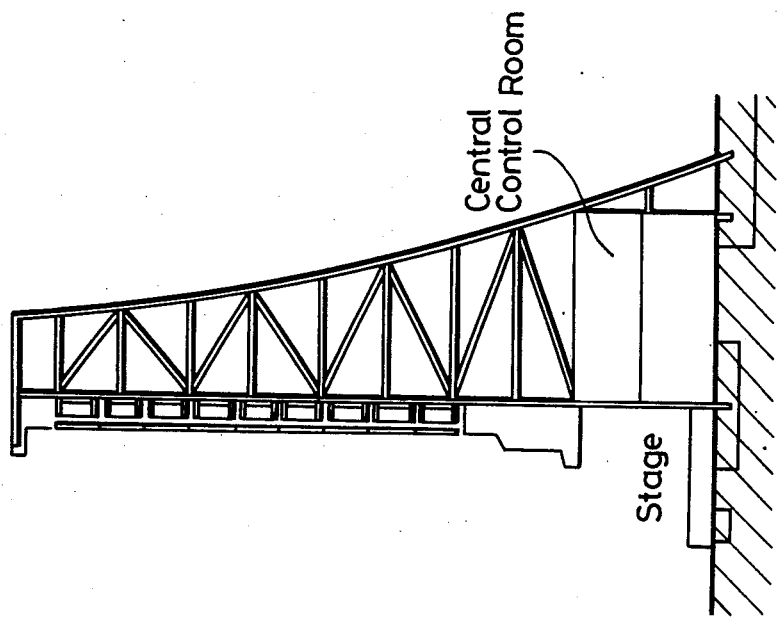
FIGS. 17A and 17B are respectively a front view and a cross-sectional view of a built-up jumbo-size display device.
Figure 17A:
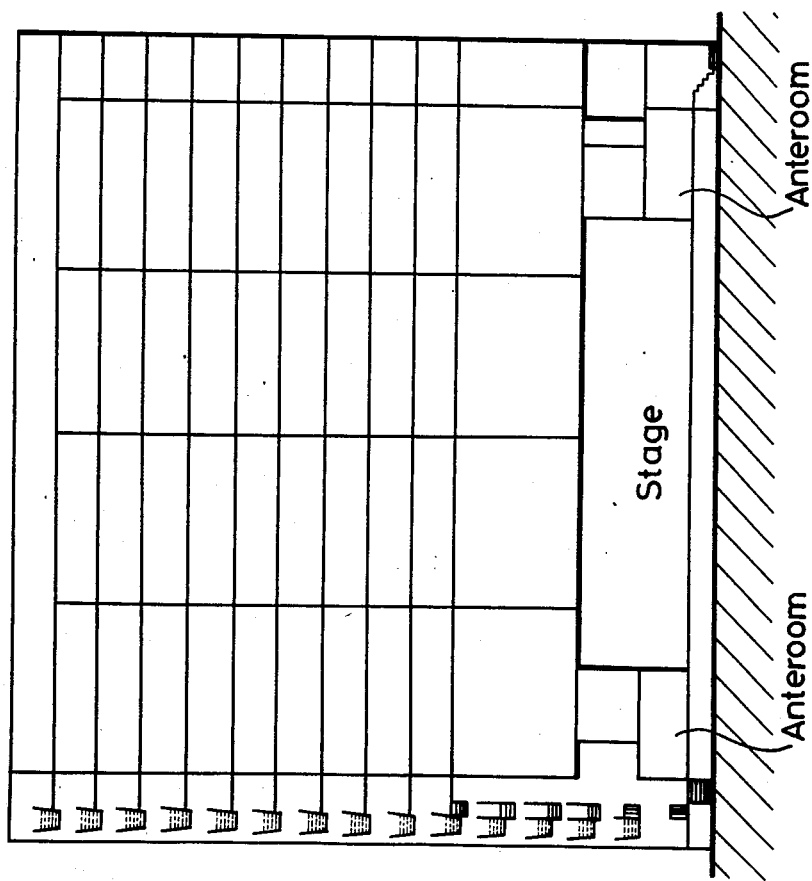

Now, the present invention will be described with reference to the attached drawings.

FIG. 18 is a systematic block diagram showing an example of the video display system according to the present invention. In this example, the video signals from a television camera 101, a VTR (video tape recorder) 102, a tuner 103 and so on are selected by an input change-over switch 104. These video signals are each a composite video signal of, for example, the NTSC system. The video signal selected by the switch 104 is supplied to a decoder 105 in which it is decoded to three color component signals of red, green and blue. These three color component signals are respectively supplied to A/D (analog to digital) converters 106R, 106G and 106B and then converted to 8 bit parallel digital signals, respectively.

These digital signals are supplied alternately to memories 171 (171R, 171G, 171B) and memories 172 (172R, 172G, 172B) each of which has one field memory capacity. These memories 171 and 172 each form a scanning converter which provides 4 horizontal lines from 5 horizontal lines. Further, for 189 horizontal lines, for example, selected from each field of the scanning converted signal, there are derived one output at every 3 horizontal lines, totally 63 ($\times 8$ bit parallel) outputs.

In this case, the order to derive the signal from the scanning converter is a specific one such that after the supply of the signal to one of the units described previously is completed, the supply of the signal to the next neighboring or adjacent unit will be done. That is, as shown in FIG. 19, when there are two adjacent units $U_1$ and $U_2$, in one field the digital data for a segment corresponding to each cell is sequentially derived from one memory in the numbered order and after the segment data corresponding to three horizontal lines 201 to 204, 205 to 208 and 209 to 212 in the left unit $U_1$ are completely derived, the segment data corresponding to three horizontal lines 213 to 216, 217 to 220 and 221 to 224 in the right unit $U_2$ are derived. Then, the segment data deriving is shifted to the right side unit successively. The segment data corresponding to the horizontal lines marked by the corresponding numbers with dash in FIG. 19 are derived from the other memory in the next field by the interlace scanning.

Thus, in the present invention the interlaced scanning is accomplished by applying the signals to each unit and the invention provides interlaced scanning of units. Each display of each unit functions in a manner such as the three color pixels in a conventional home television receiver. Since the display of the present invention is so large, interlaced scanning of the units can be used whereas in conventional TV, the pixels are scanned.

These segment data are derived at the same time from the respective memories 171 or 172, respectively. This data deriving is carried out such that 63 data at every 3 lines are simultaneously derived. The data thus derived are supplied to a data selector 108 in which at every field the red, green and blue data are dot-sequentially selected from the memory in which no writing is being carried out to thereby form the data signal of 63 ($\times 8$ bit parallel). These data signals so formed are fed to a multiplexer 109 in which 8 bit parallel signals are respectively converted to serial data signals. The signals thus converted are supplied to an optical converter 110 and then converted thereby to the corresponding optical signal.

The optical signals of 63 data at every 3 horizontal lines are transmitted through optical-filter cables 301, 302, . . . 363 to center portions of lateral groups 401, 402, . . . 463 respectively where each group represents the total units of the display device laterally arranged.

Then, for example, in the upper most group 401 of the units, the optical signal from the optical-fiber cable 301 is fed to a photo-electric converter 111 and converted thereby to the corresponding electrical signal. This converted data signal is supplied to a demultiplexer 112 in which the serial data signal is converted to the 8 bit parallel signal. This parallel data signal is supplied through a bus line 113 to, for example, 100 units $114_1$, $114_2$, . . . $114_{100}$, which are laterally arranged, in parallel at the same time.

The signal from the photo-electric converter 111 is further supplied to a synch. separator 115 in which synchronizing signals are formed by a predetermined pattern generator. The synchronizing signals therefrom are fed to a timing generator circuit 116 in which there are respectively generated a frame pulse signal FP which is inverted at every field as shown in FIG. 20A, a unit clock signal (UCK) which has 255 cycles during a half period (1 field) of the frame pulse signal as shown in FIG. 20B, an element clock signal ECK which contains 38 cycles during two cycles of the unit clock signal UCK as shown in FIG. 20C, and a start pulse SSP which is formed by one element clock signal amount at every inversion of the frame pulse signal as shown in FIG. 20D. These frame pulse signal, unit clock signal and element clock signal are supplied together with the above data signal through the bus line 113 to the respective units $114_1$, $114_2$, . . . $114_{100}$ in parallel while the start pulse is supplied to the first unit $114_1$.

The operation similar to the above is carried out in each of the 63 groups 401, 402, . . . 463

Figure 21:
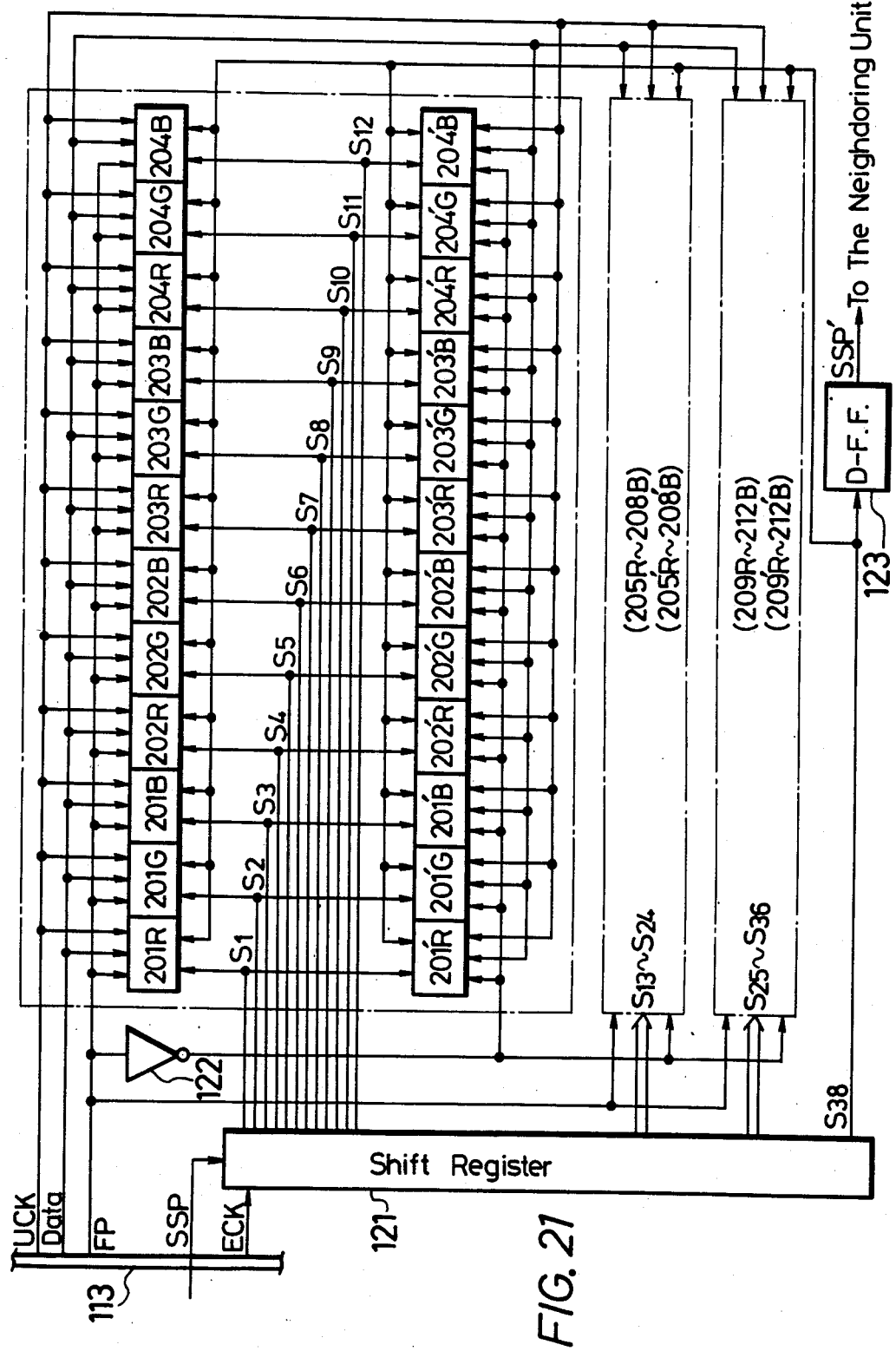

In each of the units above, the signal translating circuit is formed as shown in FIG. 21. In FIG. 21, 121 designates a shift register having 38 stages. In this case, the element clock signal ECK from the timing generator circuit 116 through the bus line 113 is supplied to the clock input terminal of the shift register 121 and the start pulse SSP is supplied to its data input terminal. Then, from the respective stages of the shift register 121 there are delivered sequentially shifted signals $S_1, S_2, \ldots S_{38}$ as shown in FIG. 20E. The signals $S_1$ to $S_{36}$ of these signals $S_1$ to $S_{38}$ are respectively supplied to the elements 201R, 201G, 201B, 202R, 202G, 202B, . . . 212R, 212G, 212B of each of cells 201 to 212 and to elements 201'R, 201'G, 201'B, 202'R, 202'G, 202'B, . . . 212'R, 212'G, 212'B of each of the cells 201' to 212'. In FIG. 21, the circuits in one-dot chain line block are equivalent with one another.

The data signal, as shown in FIG. 20F, from the bus line 113 are supplied to all the elements 201R to 212'B in parallel. The frame pulse signal FP is supplied to the elements 201R to 212B and to the elements 201'R to 212'B after being reversed in phase by an inverter 122.

The signal $S_{38}$ from the shift register 121 is supplied to a D-type flip-flop 123 which then produces a start pulse signal SSP′ to be supplied to the next neighboring unit as shown in FIG. 20G.

The signal circuit which will drive each element is constructed as shown in FIG. 22. In FIG. 22, 131 designates a latching circuit of 8-bit which is supplied at its data input terminals with the data signal from the bus line 113. An AND circuit 132 is provided which is supplied with the frame pulse signal FP or its inverted signal and one of the signals $S_1$ to $S_{36}$. The output from the AND circuit 132 is supplied to the control terminal of the latching circuit 131. A down counter 133 of 8-bit is provided which is supplied at its preset terminals with the output from the latching circuit 131, at its load terminal with the load pulse (signal $S_{38}$) from the shift register 121 and at its clock input terminal with the unit clock signal UCK from the bus line 113, respectively. When the counter 133 is in a condition except all-zero condition, it produces an output signal which is supplied to the first grid $G_1$ of each element mentioned above. The output signal of the counter 133 is phase-inverted by an inverter 134 and then supplied to the count-stop terminal of the counter 133.

Accordingly, in each element of each unit, at the timings of the signals $S_1$ to $S_{36}$, the data from the bus line 113 are latched to the latching circuit 131 of the corresponding element and then held therein. The data held therein are preset to the counter 133 at the timing of the signal $S_{38}$. The preset data are then counted down until the counter 133 becomes in all-zero condition so that at the output terminal of the counter 133 there is developed the PWM signals in accordance with each data signal. In this case, the counter 133 counts down the preset data in response to the unit clock signal UCK. Since this unit clock signal has 25 cycles during 1 field period, at the data having the largest value, a display element is displayed during one field period continuously while at the data having the smallest value the display element is not displayed so that the display therebetween can be divided into 256 brightness steps. The first grid of each element can be driven by the PWM signal.

Further, at the timing of the signal $S_{38}$ the start pulse signal for the next neighboring unit is produced. Thereafter, the operation similar to the above operation is sequentially carried out for 100 units laterally arranged. Moreover, the data latching operation of each unit is performed during the 2-cycle period of the unit clock signal UCK so that such operation for 100 unit laterally arranged is completed in 200 cycles. Therefore, by utilizing the remaining 55 cycles, special control signals such as the synchronizing signal and so on can be transmitted.

Since in the next field the frame pulse signal FP is inverted in phase, the similar operation is carried out for the other picture elements of the interlace scanning. At this time, the preset pulse is supplied to the picture elements which were driven in the previous field, so that the same display is performed twice on each picture element during the successive 2 field intervals.

Thus, the displays are performed on 100 units which are laterally arranged. Further, such display is performed for the 63 vertical direction groups of units in parallel at the same time, whereby the whole picture is displayed.

Thus, a jumbo-size picture of 25 m (column)×40 m (row) is displayed. According to the above picture display system, since the data are sequentially transmitted at every unit and after the data transmission of one display unit is completed, the data of the next neighboring display unit is transmitted, the display operation is completed at each unit. As a result, the wiring between the respective units is only one line to transmit the start pulse SSP′ from one unit to the next unit so that the connection becomes quite simple. The supply of the data signal and so on from the bus line to each unit can be performed by using a multi-contact connector.

Therefore, when the units are attached, exchanged or the like, the work becomes simple and the assembling and repairing thereof can be easily done. For example, when one unit becomes out of order, it is sufficient that the troubled unit be exchanged for a new good unit. Upon this exchange, since the number of the lines for the electrical connection is small, the exchange can be done rapidly and easily. Further, concern that trouble will be caused by open contacts and so on is reduced.

Further, as an emergency measure, it is enough that a counter which can count up to 38 is connected between the input and output terminals for the start pulse of a troubled unit and then this troubled unit can be removed. In this case, no bad effects occur in the other units. Furthermore, when the operation of a certain unit itself is checked, since the signal is completed within the unit, the check is very easy.

Also, since the data is transmitted in parallel to every laterally arranged unit, the transmission speed is low. That is, the data transmission speed in the above embodiment becomes as follows.

$$60 \times 255 \times 38/2 = 290.7 \text{ (kHz)}$$

This speed is lower than the tolerable range (300 kHz) of a flat cable(bus line), so that a conventional flat cable can be employed.

Furthermore, in the above example, since the PWM circuit is formed by using the down counter, it can be provided very simply.

Further, the data transmission is such that the data of 2-fields of the interlace scanning are transmitted in one frame interval and the data is rewritten only once in each picture element at one frame interval. However, the display is repeated in sequential 2 fields and the display frequency is 60 Hz so that the generation of flicker can be suppressed.

As set forth above, according to the present invention, the signal transmission becomes simple and the luminance modulation can be carried out effectively by the simple circuit construction.

Further, the assembling and repairing work of the parts become easy.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claims only.

I claim as my invention:

1. A video display system comprising:

a video signal source for supplying a video signal of odd fields and even fields interlaced with each other;

a first set of display cells for said odd fields;

a second set of display cells for said even fields arranged alternately with said first set of display cells in an interlaced fashion;

said first and second sets of display cells being separated into a plurality of units each of which includes display cells arranged in an X-Y matrix form; and first means for supplying the video signal of said odd fields to said first set of display cells during even fields; and second means for supplying the video signal of said even fields to said second set of display cells during odd fields succeeding said even fields; characterized in that said first means includes latching means for latching the video signal of said odd fields and supplying the latched signal to said first set of display cells during said even fields succeeding said odd fields; and said second means includes latching means for latching the video signal of said even fields and supplying the latched signal to said second set of display cells during said odd fields succeeding said even fields and wherein an interlaced scanning of said units is performed.

2. A video display system according to claim 1, wherein said latching means of said first and second means includes a PWM circuit for controlling the brightness of said display cells in accordance with the video signal.

3. A video display system according to claim 2, wherein said PWM circuit includes a counter which is supplied with said latched signal as preset data and counts down the preset data with clock signals applied thereto.

4. A video display system comprising:
a plurality of units arranged to form a display device, each of said units including a plurality of display cells arranged in an X-Y matrix form; and a video signal source for supplying the video signal of odd fields and even fields; and driving means for supplying the video signal of said odd and even fields to said display cells such that half of the display cells are driven during said odd fields and the other half of the display cells are driven during said even fields; characterized in that said driving means includes latching means for latching the video signal in order to supply the latched video signal to said half of the display cells for a display during said even fields and in order to supply the latched signal to said other half of display cells for a display during said odd fields and wherein interlaced scanning of said units occurs.

5. A video display system according to claim 4, wherein said display cells are separated into a plurality of units each of which includes display cells arranged in an X-Y matrix form; and said driving means supplies the video signal to said units in a manner that the display cells included in one unit are supplied with the video signal in succession to complete a whole display of said one unit and the display cells included in a neighboring unit are then supplied with the video signal to complete a whole display of said neighboring unit such that interlaced scanning of said units occurs.

6. A video display system comprising:
a video signal source for supplying a video signal of odd fields and even fields interlaced with each other;

a first set of display cells for said odd fields;

a second set of display cells for said even fields arranged alternately with said first set of display cells in an interlaced fashion;

said first and second sets of display cells being separated into a plurality of units each of which includes display cells arranged in an X-Y matrix form; and driving means for supplying said video signal to said units; characterized in that said driving means supplies the video signal to said units in a manner that the display cells included in one unit are supplied with the video signal in succession to complete a whole display of said one unit and the display cells included in a neighboring unit are then supplied with the video signal to complete a whole display of said neighboring unit so that interlaced scanning of said units occur.

7. A video display system comprising:
a video display source for supplying a video signal;

a plurality of units arranged to form a display device, each of said units including a plurality of display cells arranged in an X-Y matrix form; and driving means for supplying said video signal to said units; characterized in that said driving means supplies the video signal to said units in a manner that the display cells included in one unit are supplied with the video signal in succession to complete a whole display of said one unit and the display cells included in a neighboring unit are then supplied with the video signal to complete a whole display of said neighboring unit so that interlaced scanning of said units occur.

* * * * *